US012648199B2

(12) United States Patent
Chen et al.

(10) Patent No.: US 12,648,199 B2
(45) Date of Patent: Jun. 2, 2026

(54) ISOLATION STRUCTURE FOR SOURCE/DRAIN OF SEMICONDUCTOR DEVICE

(71) Applicant: Taiwan Semiconductor Manufacturing Co., Ltd., Hsinchu (TW)

(72) Inventors: Chao-Shuo Chen, Hsinchu (TW); Chia-Der Chang, Hsinchu (TW); Yi-Jing Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 560 days.

(21) Appl. No.: 17/874,171

(22) Filed: Jul. 26, 2022

(65) Prior Publication Data

US 2022/0367633 A1    Nov. 17, 2022

Related U.S. Application Data

(62) Division of application No. 16/996,647, filed on Aug. 18, 2020, now Pat. No. 11,664,423.

(51) Int. Cl.
*H10D 62/10*      (2025.01)
*H10D 30/01*      (2025.01)
(Continued)

(52) U.S. Cl.
CPC ......... *H10D 62/151* (2025.01); *H10D 30/024* (2025.01); *H10D 30/6211* (2025.01);
(Continued)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823418; H01L 21/823814; H01L 21/823425; H01L 29/0847; H01L 29/7848; H01L 29/66636;
(Continued)

(56) References Cited

U.S. PATENT DOCUMENTS 10,373,875 B1    8/2019  Xie et al.
10,373,877 B1    8/2019  Wang et al.
(Continued)

*Primary Examiner* — Younes Boulghassoul
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, an insulating stack formed over the substrate, a vertical structure formed through the insulating stack, a source/drain region formed over the vertical structure, and an isolation structure formed adjacent to the source/drain region and protruding the insulating stack. The source/drain region can include a first side surface and a second side surface. A lateral separation between the first side surface and the vertical structure can be greater than an other lateral separation between the second side surface and the vertical structure.

20 Claims, 14 Drawing Sheets

(51) Int. Cl.

| | |
|---|---|
| *H10D 30/62* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10P 50/00* | (2026.01) |
| *H10P 50/24* | (2026.01) |
| *H10W 10/00* | (2026.01) |
| *H10W 10/10* | (2026.01) |
| *H10W 10/17* | (2026.01) |
| *H10W 20/00* | (2026.01) |

(52) U.S. Cl.
CPC ....... *H10D 30/6219* (2025.01); *H10D 62/116* (2025.01); *H10D 64/0111* (2026.01); *H10D 64/01324* (2026.01); *H10D 84/013* (2025.01); *H10D 84/0135* (2025.01); *H10D 84/0151* (2025.01); *H10D 84/0158* (2025.01); *H10D 84/038* (2025.01); *H10P 50/242* (2026.01); *H10P 50/691* (2026.01); *H10W 10/011* (2026.01); *H10W 10/0143* (2026.01); *H10W 10/10* (2026.01); *H10W 10/17* (2026.01); *H10W 20/069* (2026.01)

(58) Field of Classification Search
CPC ........... H01L 29/66575; H01L 29/0649; H01L 29/0653; H01L 21/823481; H01L 21/823878; H01L 21/76224; H01L 21/76229; H01L 21/76232; H10B 12/36; H10B 12/056; H10D 84/0158; H10D 84/0193; H10D 84/834; H10D 84/853; H10D 86/011; H10D 86/215; H10D 30/024–0245; H10D 30/62–6219; H10D 62/151; H10D 62/021; H10D 84/013; H10D 84/0133; H10D 84/017; H10D 30/6713; H10D 30/0223; H10D 30/797; H10D 62/115; H10D 62/116; H10D 84/0151; H10D 84/0153; H10D 84/0188; H10D 30/0243; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833

See application file for complete search history.

(56) References Cited

U.S. PATENT DOCUMENTS

| | | | |
|---|---|---|---|
| 2018/0151564 A1 | 5/2018 | Lee et al. | |
| 2019/0006345 A1 | 1/2019 | Wang et al. | |
| 2019/0164741 A1* | 5/2019 | Wen ....................... | H10D 84/08 |
| 2019/0164838 A1* | 5/2019 | Chang ................ | H10D 84/0151 |
| 2019/0165155 A1* | 5/2019 | Chang ................ | H10D 84/0151 |
| 2019/0288114 A1* | 9/2019 | Kim ................... | H10D 30/6211 |
| 2020/0006334 A1* | 1/2020 | Hsueh ............... | H01L 21/32136 |
| 2020/0058649 A1* | 2/2020 | Ching .............. | H01L 21/76224 |
| 2020/0135472 A1* | 4/2020 | Jang .................. | H10D 84/0158 |
| 2020/0176318 A1* | 6/2020 | Jang ................. | H01L 21/76224 |
| 2021/0313181 A1* | 10/2021 | Chen .................... | H01L 23/535 |
| 2022/0013364 A1* | 1/2022 | Chang ............... | H10D 30/6211 |

* cited by examiner

200

205 — Provide a transistor structure that has a S/D region

210 — Reshape the S/D region to reduce a lateral width of the S/D region

215 — Form an insulating structure over the reshaped S/D region

225 — Form a metal contact over the reshaped S/D region

ISOLATION STRUCTURE FOR SOURCE/DRAIN OF SEMICONDUCTOR DEVICE

CROSS-REFERENCE TO RELATED APPLICATION

This patent application is a divisional of U.S. patent application Ser. No. 16/996,647, filed on Aug. 18, 2020, and titled "Source/Drain Structure for Semiconductor Devices," which is incorporated by reference herein in its entirety.

BACKGROUND

Advances in semiconductor technology have increased the demand for transistors with higher performance for high speed applications. To meet this demand, it is essential to minimize the parasitic capacitances associated with the transistors to improve the speed of the integrated circuits. A challenge in improving transistor speed is capacitive coupling among transistor terminals.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 4A-9A illustrate cross-sectional views of a semiconductor device at various stages of its fabrication process, according to some embodiments.

FIGS. 4B-9B illustrate cross-sectional views of a semiconductor device at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
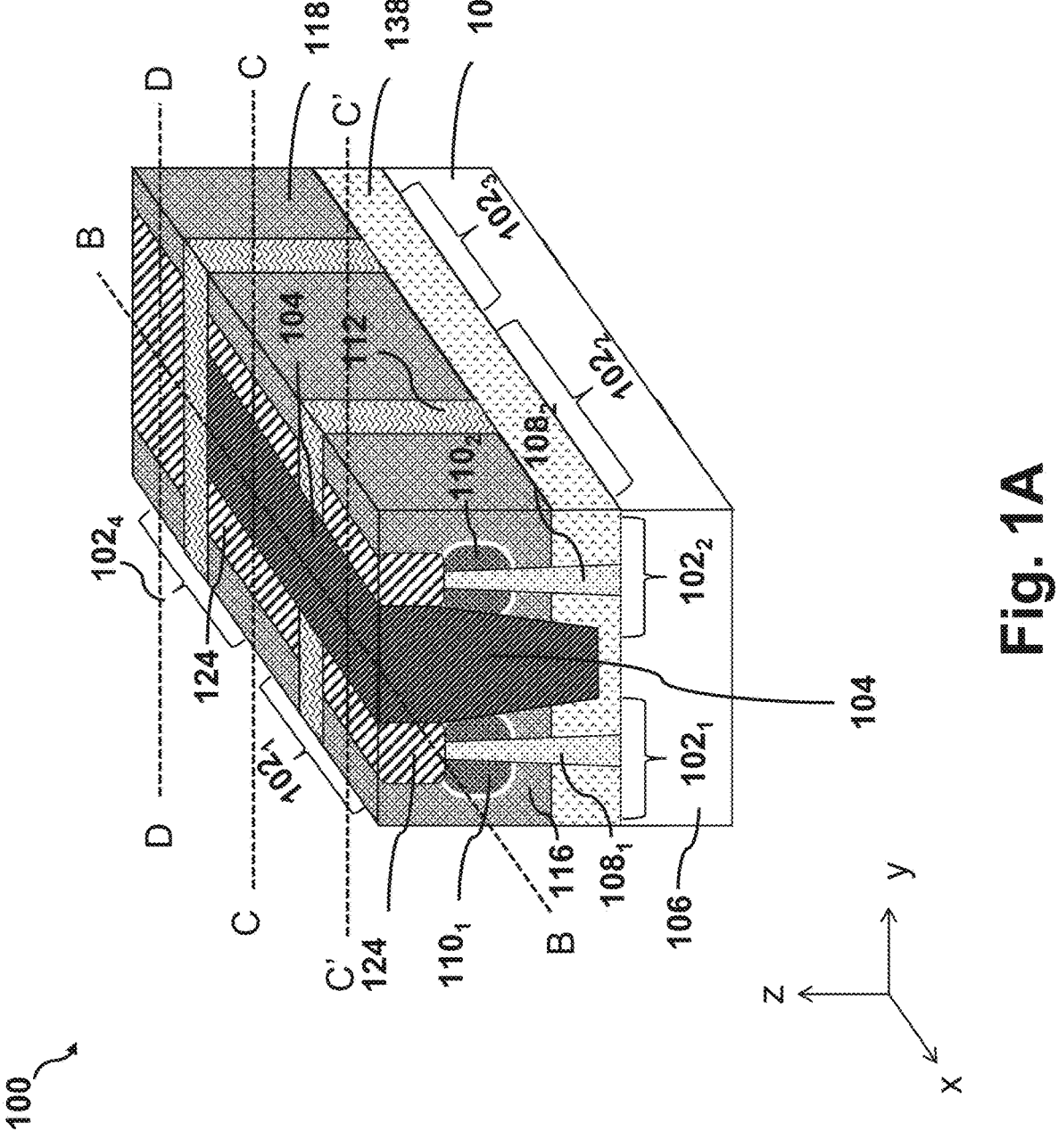
FIG. 1A illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

As used herein, the term "insulating layer" refers to a layer that functions as an electrical insulator (e.g., a dielectric layer).

As used herein, the term "selectivity" refers to the ratio of the etch rates of two materials under a same etching condition.

As used herein, the term "high-k" refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

Fins associated with fin field effect transistors (finFETs) or gate-all-around (GAA) FETs may be patterned by any suitable method. For example, the fins may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (IC)s having higher performance for high-speed applications. In the course of the IC evolution, raised source/drain (RSD) structures have been adopted in the transistor to provide reduced contact resistance and enhanced channel stress to improve transistor speed. The RSD structure can be formed, for example, by epitaxially growing doped regions adjacent to the transistor's channel region. The epitaxially grown RSD structure can have an extension laterally extending beyond the transistor's width, in which the lateral extension can introduce a parasitic capacitance between the channel region (e.g., gate terminal) and the source/drain region (e.g., source terminal and/or drain terminal), thus degrading the operating speed of the transistor and the IC.

The present disclosure is directed to a fabrication method and a transistor with a source/drain (S/D) structure that has a reduced lateral extension. For example, the S/D structure can be formed over side surfaces of a fin structure, where the S/D structure can be fabricated to reduce its lateral volume extending over the fin structure's side surfaces. In some embodiments, a portion of the S/D structure formed over a side surface of the fin structure can be fabricated with a narrower width than another portion of the S/D structure formed over an opposite side surface of the fin structure. In some embodiments, a portion of the S/D structure formed over a side surface of the fin structure can be fabricated to have an asymmetric shape with respect to another portion of the S/D structure formed over an opposite side surface of the fin structure. In some embodiments, the S/D structure and the transistor's gate structure can be fabricated to reduce the S/D lateral extension and isolate the gate structure from adjacent transistors (e.g., cut metal-gate scheme). A benefit of the present disclosure, among others, is to suppress the parasitic capacitance between the S/D structure and the transistor's gate structure, thus decreasing the RC time delay of the transistor and improving the transistor's operating speed.

Figure 1B:
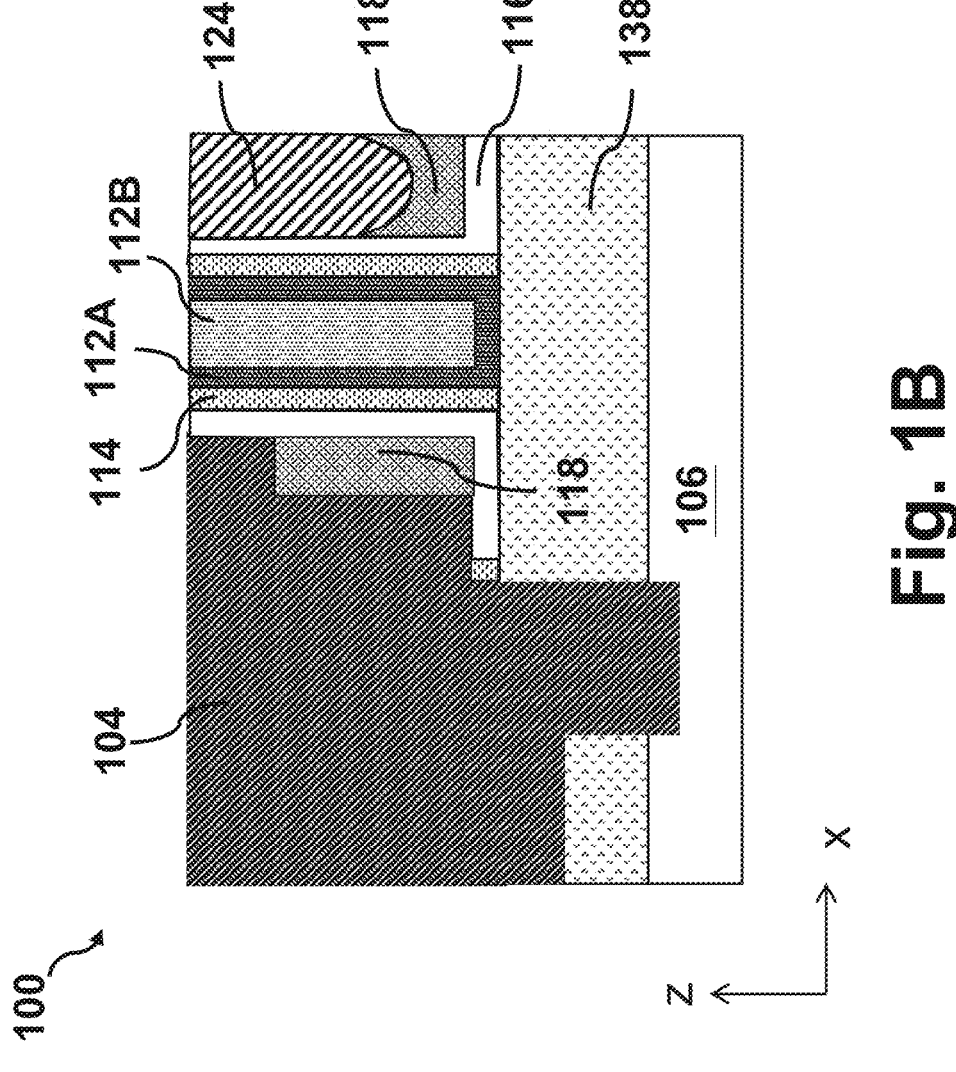
FIGS. 1B-1H illustrate cross-sectional views of a semiconductor device, according to some embodiments.
Figures 1C, 1D:
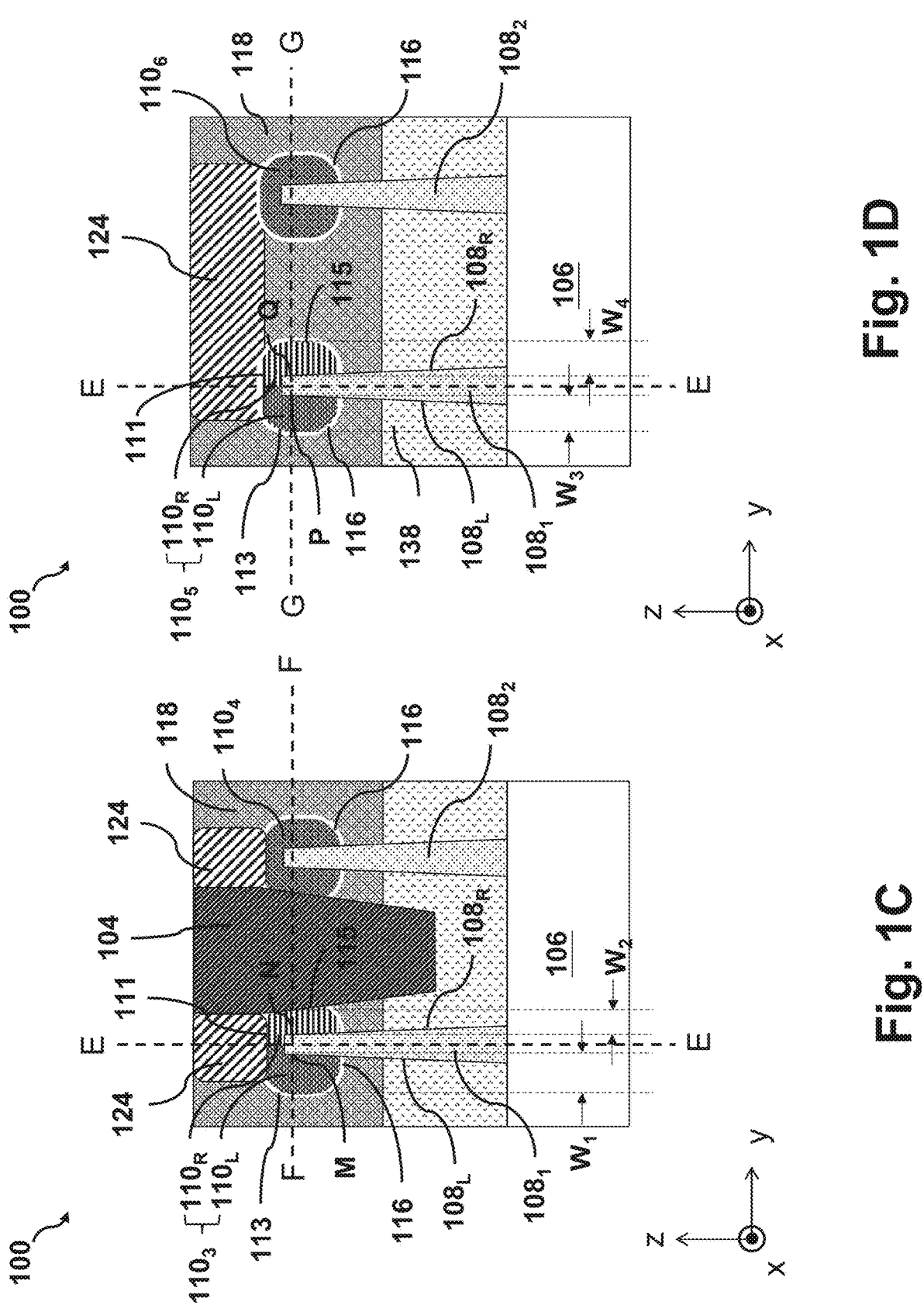
Figure 1F:
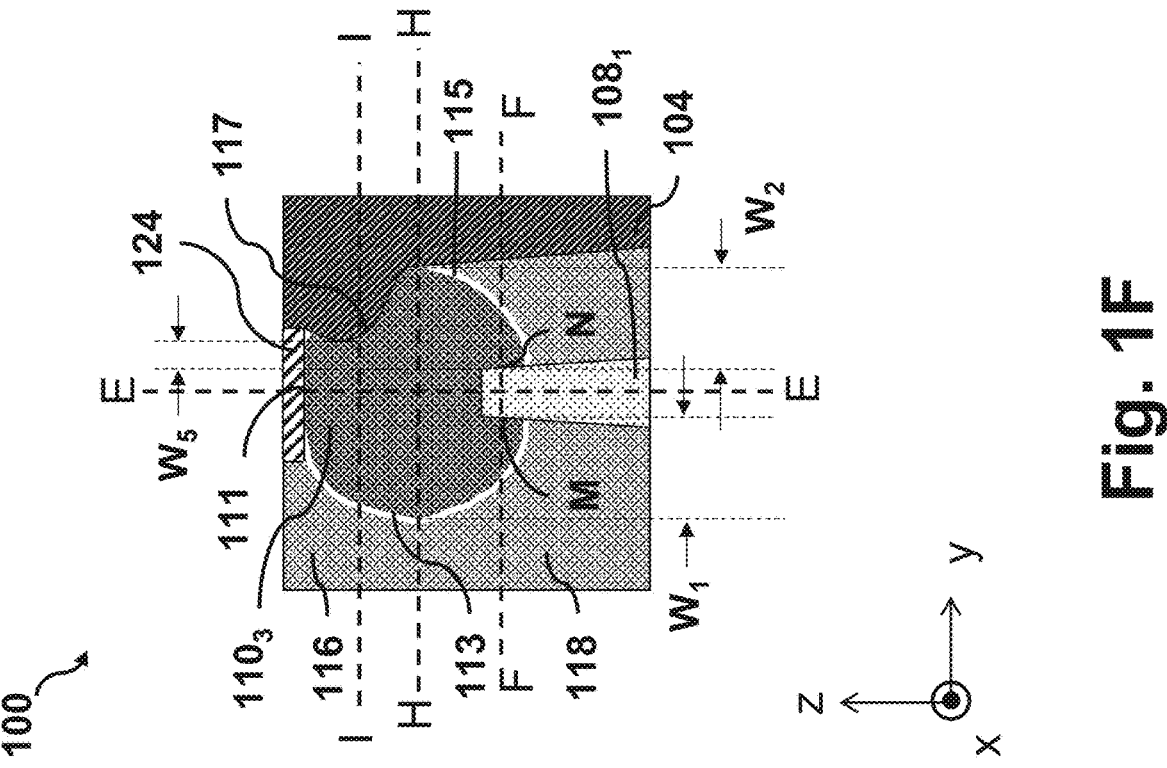
Figure 1E:
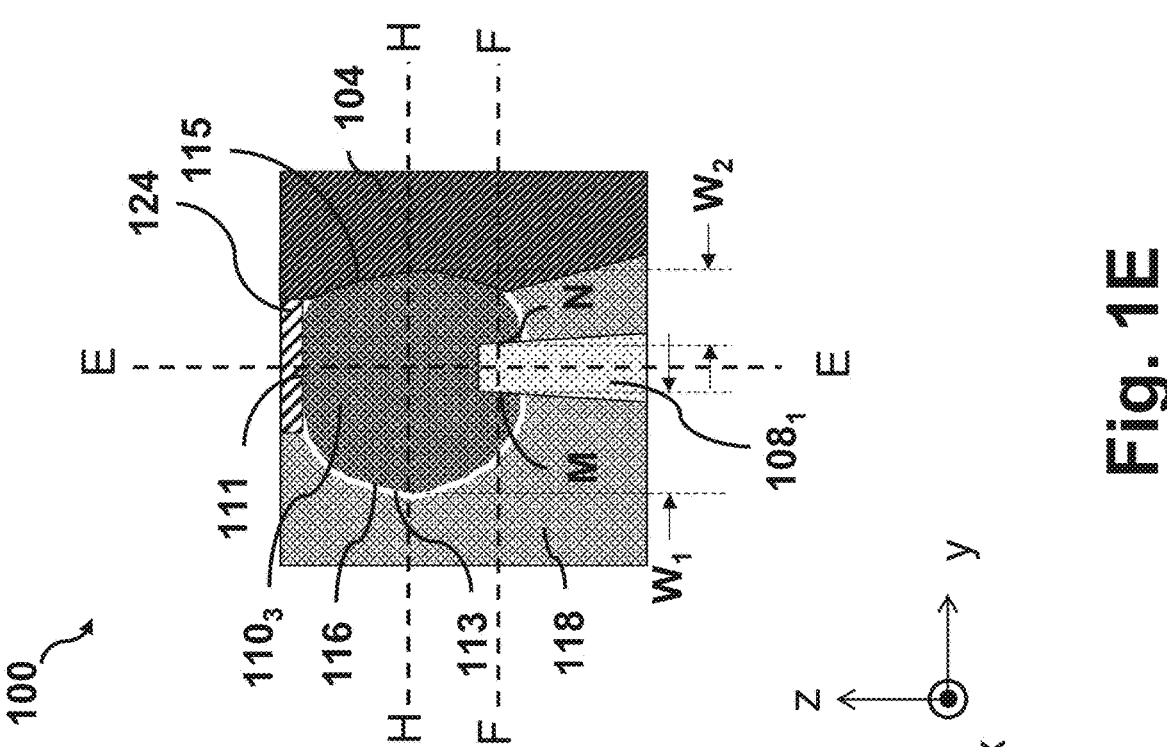
Figures 1G, 1H:
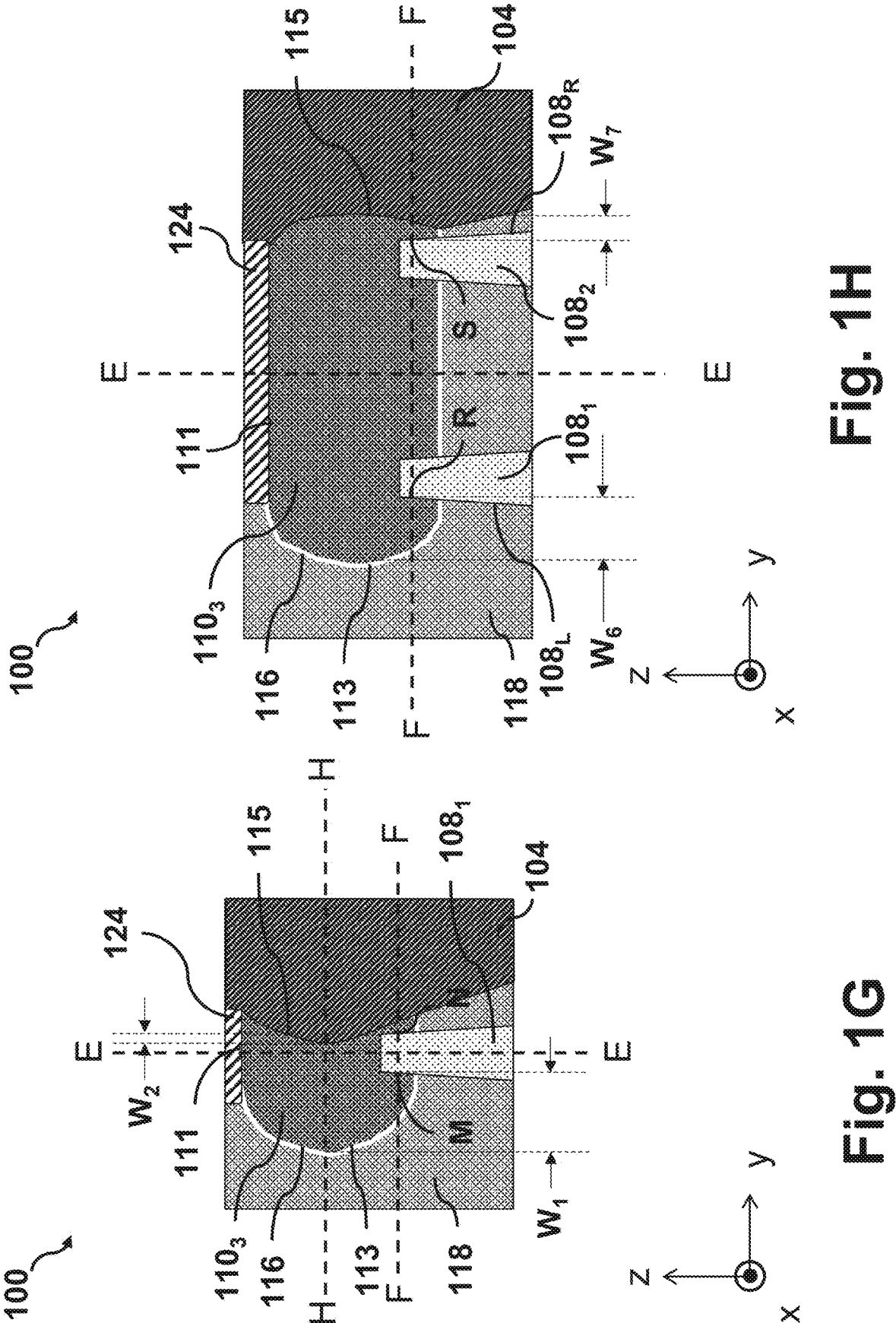

A semiconductor device 100 having a multiple FETs 102 (e.g., FETs $102_1$-$102_4$) formed over a substrate 106 is described with reference to FIGS. 1A-1H, according to some embodiments. FIG. 1A illustrates an isometric view of semiconductor device 100, according to some embodiments. FIG. 1B illustrates a cross-sectional view along line B-B (e.g., along a gate region) of semiconductor device 100, according to some embodiments. FIGS. 1C and 1E-1H illustrate cross-sectional views along lines C-C (e.g., along source/drain (S/D) regions) of semiconductor device 100, according to some embodiments. The cross-sectional view along line C'-C' in FIG. 1A can be similar to the cross-sectional view in FIG. 1C. FIG. 1D illustrates a cross-sectional view along line D-D (e.g., along source/drain (S/D) regions) of semiconductor device 100, according to some embodiments. Semiconductor device 100 can be included in a microprocessor, memory device, or other integrated circuit (IC). The scale and shapes of various labeled elements in isometric and cross-sectional views of semiconductor device 100 are shown for illustration purposes and not intended to be limiting. Further, the discussion of elements in FIGS. 1A-1H with the same annotations applies to each other, unless mentioned otherwise. Also, though each FET 102 shown in FIGS. 1A-1H is a fin field effect transistor (finFET), each FET 102 can be a gate-all-around (GAA) FET, according to some embodiments.

Referring to FIG. 1A, each FET 102 (e.g., FETs $102_1$-$102_4$) can include a fin structure 108 extending along an x-axis, a gate structure 112 traversing through fin structure 108 along a y-axis, and source/drain (S/D) regions 110 formed over portions of fin structure 108. Although FIG. 1A shows each fin structure 108 accommodating two FETs 102, any number of FETs 102 can be disposed along each fin structure 108. In some embodiments, FET 102 can include multiple fin structures 108 extending along a first horizontal direction (e.g., in the x-direction), and gate structure 112 traversing through the multiple fin structures 108 along a second horizontal direction (e.g., in the y-direction). In some embodiments, multiple FETs 102 (e.g. FETs 1023 and 1024) can have a common gate structure 112. In some embodiments, gate structures 112 of multiple FETs 102 (e.g., FETs $102_1$ and $102_2$) can be isolated from each other by an isolation structure 104.

Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants (e.g., phosphorus (P) or arsenic (As)).

Each fin structure 108 (e.g., fin structures $108_1$ and $108_2$) can be formed over substrate 106 and can include a material similar to substrate 106. In some embodiments, fin structure 108 can include a material having a lattice constant substantially close to (e.g., lattice mismatch within 5%) that of substrate 106. In some embodiments, fin structure 108 can include a material identical to substrate 106. In some embodiments, fin structure 108 can include multiple channel layers, each made of identical or different materials from each other.

Semiconductor device 100 can further include shallow trench isolation (STI) regions 138 configured to provide electrical isolation for fin structure 108. For example, STI regions 138 can electrically isolate fin structure $108_1$ from fin structure $108_2$. STI regions 138 can provide electrical isolation between FETs 102 residing on fin structure 108. Also, STI regions 138 can provide electrical isolation between FETs 102 and neighboring active and passive elements (not shown in FIG. 1A) integrated with or deposited on substrate 106. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials.

Referring to FIGS. 1A and 1B, gate structure 112 can be multi-layered structures that wraps around portions of one or more fin structures 108 to modulate FET 102. For example, gate structure 112 can wrap around portions of fin structures $108_1$ to modulate a conductivity of FET $102_1$'s channel. In some embodiments, gate structure 112 can be referred to as gate-all-around (GAA) structures, where FET 102 can be referred to as a GAA FET 102. Gate structure 112 can include a gate dielectric layer 112A, a gate electrode 112B disposed on dielectric layer 112A, and gate spacers 114 disposed on sidewalls of gate electrode 112B.

Gate dielectric layer 112A can be wrapped around portions of fin structure 108 and can be further disposed between gate electrode 112B and S/D regions 110 to prevent electrical shorting in between. Gate dielectric layer 112A can include silicon oxide and can be formed by chemical vapor deposition (CVD), atomic layer deposition (ALD), physical vapor deposition (PVD), e-beam evaporation, or other suitable processes. In some embodiments, gate dielectric layer 112A can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, gate dielectric layer 112A can include a single layer or a stack of insulating material layers. Gate dielectric layer 112A can have a thickness ranging from about 1 nm to about 5 nm. Other materials and formation methods for gate dielectric layer 112A are within the scope and spirit of this disclosure.

Gate electrode 112B can function as a gate terminal for FET 102. Gate electrode 112B can include a metal stack wrapping around portions of fin structure 108. In some embodiments, gate electrode 112B can include a gate barrier layer (not shown in FIGS. 1A and 1B), a gate work function layer (not shown in FIGS. 1A and 1B), and a gate metal fill layer (not shown in FIGS. 1A and 1B). The gate barrier layer can serve as a nucleation layer for subsequent formation of a gate work function layer. In some embodiments, the gate barrier layer can prevent a diffusion of metals (e.g., aluminum) from the gate work function layer to underlying layers (e.g., gate dielectric layers 112A). The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. The stack of metal layers can include metals having work function values equal to or different from each other. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and combinations thereof. In some embodiments, the gate work function layer can include Al-doped metal, such as Al-doped Ti, Al-doped TiN, Al-doped Ta, and Al-doped TaN. The gate metal fill layer can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof. Other materials for the gate barrier layer, the gate work function layer, and the gate metal fill layer are within the scope and spirit of this disclosure.

Gate spacer 114 can be in physical contact with gate dielectric layers 112A, according to some embodiments. Gate spacer 114 can have a low-k material with a dielectric constant less than about 3.9. For example, gate spacer 114 can include insulating material, such as silicon oxide, silicon nitride, a low-k material, and a combination thereof. In some embodiments, gate spacer 114 can have a thickness ranging from about 2 nm to about 10 nm. Other materials and thicknesses for gate spacer 114 are within the scope and spirit of this disclosure.

Referring to FIGS. 1A, 1C, and 1D, each FET 102 can have S/D regions 110 formed at opposite sides (e.g., along x-direction) of gate structure 112. Each S/D region 110 can include a top surface 111, a side surface 113, and a side surface 115 opposite to side surface 113. Further, each S/D region 110 can be partitioned into lateral S/D portions $110_L$ and $110_R$. Lateral S/D portions $110_L$ can include side surface 113. Similarly, lateral S/D portion $110_R$ can include side surface 115. In some embodiments, S/D region 110 can be partitioned into lateral S/D portions $110_L$ and $110_R$ by a cross-sectional line E-E that crosses a midpoint of fin structure 108's top. By way of example and not limitation, cross-sectional line E-E can be substantially perpendicular to substrate 106 and can cross a midpoint of fin structure 108 to substantially bisect fin structure 108. In some embodiments, lateral S/D portions $110_L$ and $110_R$ can be respectively formed over fin structure 108's opposite sides. For example, lateral S/D portion $110_L$'s side surface 113 can be laterally (e.g., in the opposite y-direction) positioned over fin structure 108's side surface $108_L$. Similarly, lateral S/D portion $110_R$'s side surface 115 can be laterally (e.g., in the y-direction) positioned over fin structure 108's side surface $108_R$.

Each S/D region 110 (e.g., S/D regions $110_1$-$110_6$) can include an epitaxially-grown semiconductor material. In some embodiments, the epitaxially grown semiconductor material can be the same material as the material of substrate 106. In some embodiments, the epitaxially-grown semiconductor material can have a lattice constant substantially close to (e.g., lattice mismatch within 5%) that of the material of substrate 106. In some embodiments, the epitaxially-grown semiconductor material can include: (i) a semiconductor material, such as Ge and Si; (ii) a compound semiconductor material, such as GaAs and AlGaAs; or (iii) a semiconductor alloy, such as SiGe and GaAsP. S/D region 110 can be doped with p-type dopants or doped with n-type dopants. The p-type dopants can include B, In, Al, or Ga. The n-type dopants can include P or As. In some embodiments, S/D region 110 can have multiple sub-regions (not shown) that may include SiGe and may differ from each other based on, for example, doping concentration, epitaxial growth process conditions, and/or relative concentration of Ge with respect to Si.

In some embodiments, one of lateral S/D portions $110_L$ and $110_R$ can have a smaller volume than the other. For example, referring to FIG. 1C, S/D region $1103$'s lateral S/D portion $110_R$ can have a smaller volume than S/D region $110_3$'s lateral S/D portion $110_L$. In some embodiments, a ratio of lateral S/D portion $110_R$'s volume to lateral S/D portion $110_L$'s volume can be from about 0.05 to about 0.65, from about 0.05 to about 0.6, or from about 0.1 to about 0.5.

By way of example and not limitation, the above-noted volume ratio of S/D region $110_3$'s lateral S/D portion $110_L$ to lateral S/D portion $110_R$ can be achieved by method 200 (discussed below). Further, since the volume of S/D region $110_3$'s lateral S/D portion $110_R$ can be reduced, the overall parasitic capacitance between S/D region $110_3$ and gate structure 112 can be reduced, thus enhancing the overall operating speed of FET $102_1$ and/or FET $102_4$.

In some embodiments, lateral S/D portions $110_L$ and $110_R$ can have a substantially equal volume to each other. For example, referring to FIG. 1D, S/D region $110_5$'s lateral S/D portion $110_R$ can have a substantially equal volume to S/D region $110_5$'s lateral S/D portion $110_L$. In some embodiments, a ratio of lateral S/D portion $110_R$'s volume of S/D region $110_5$ to S/D portion $110_L$'s volume of S/D region $110_5$ can be from about 0.5 to about 1.5, from about 0.6 to about 1.4, or from about 0.7 to about 1.3. By way of example and not limitation, the above-noted volume variation between S/D region $110_5$'s lateral S/D portions $110_L$ and $110_R$ can be caused by a process variation (e.g., precursor gas flow's fluctuation) associated with an epitaxial growth process that grows S/D region 110's semiconductor material.

In some embodiments, one of lateral S/D portions $110_L$ and $110_8$ can have a reduced side extension (e.g., along the y-direction) compared to the other. For example, referring to FIG. 1C, a cross-sectional line F-F substantially parallel to substrate 106 can cross points M and N over fin structure 108's side surfaces $108_L$ and $108_R$. A lateral width $W_2$ between S/D region $110_3$'s lateral S/D portion $110_R$'s side surface 115 and fin structure 108's side surface $108_R$ (e.g., point N) can be narrower than a lateral width $W_1$ between S/D region $110_3$'s lateral S/D portion $110_L$'s side surface 113 and fin structure 108's side surface 104 (point M). In some embodiments, a difference between lateral widths $W_1$ and $W_2$ can be from about 2 nm to about 25 nm, from about 3 nm to about 20 nm, or from about 5 nm to about 15 nm. In some embodiments, a ratio of lateral width $W_2$ to lateral width $W_1$ can range from about 0.05 to about 0.75, from about 0.05 to about 0.6, or from about 0.05 to about 0.5. In some embodiments, lateral width $W_1$ can represent a lateral (e.g., along y-direction) separation between an outermost portion of side surface 113 and side surface $108_L$, where lateral width $W_1$ can be from about 5 nm to about 20 nm. In some embodiments, In some embodiments, lateral width $W_2$ can represent a lateral (e.g., along y-direction) separation between an outermost portion of side surface 115 and side surface $108_R$, where lateral width $W_2$ can be from about 2 nm to about 15 nm or from about 2 nm to about 10 nm. By way of example and not limitation, the above-noted lateral extension width difference/ratio between S/D region $110_5$'s lateral S/D portions $110_L$ and $110_R$ can be achieved by method 200 (discussed below). Further, since the lateral extension width $W_2$ of S/D region $1103$'s lateral S/D portion $110_R$ can be reduced, the overall parasitic capacitance between S/D region $110_3$ and gate structure 112 can be reduced, thus enhancing the overall operating speed of FET $102_1$ and/or FET $102_4$.

In some embodiments, lateral S/D portions $110_L$ and $110_R$ can have a substantially equal side extension (e.g., along the y-direction). For example, referring to FIG. 1D, for a cross-sectional line G-G substantially parallel to substrate 106 and crossing points P and Q on fin structure 108's side surfaces $108_L$ and $108_R$, a lateral width $W_3$ between S/D region $110_5$'s lateral S/D portion $110_L$'s side surface 113 and fin structure 108's side surface $108_L$ (point M) can be substantially equal to a lateral width $W_4$ between S/D region $110_5$'s lateral S/D portion $110_R$'s side surface 115 and fin structure 108's side surface $108_R$ (point N). In some embodiments, a difference between lateral widths $W_3$ and $W_4$ can be from about 0 nm to about 10 nm or from about 0 nm to about 7 nm. In some embodiments, a ratio of lateral width $W_4$ to lateral width $W_3$ can range from about 0.5 to about 1.5, from about 0.6 to about 1.4, or from about 0.7 to about 1.3. In some embodiments, cross-sectional line G-G can substantially and vertically (e.g., in the z-direction) level with cross-sectional line F-F (shown at FIG. 1C), where width $W_3$, width $W_4$, and width $W_1$ (shown at FIG. 1C) can be substantially equal to each other. By way of example and not limitation, the above-noted lateral extension width variation between S/D region $110_5$'s lateral S/D portions $110_L$ and $110_R$ can be caused by a process variation (e.g., precursor gas flow's fluctuation) associated with an epitaxial growth process that grows S/D region 110's semiconductor material.

In some embodiments, the shapes of lateral S/D portions 110L and $110_R$ can be substantially asymmetric to each other with respect to cross-sectional line E-E. For example, referring to FIG. 1C, for a cross-sectional line (e.g., cross-sectional line F-F) substantially parallel to substrate 106 and crossing S/D region 110 (e.g., S/D region $110_3$), side surface 113 of S/D region $110_3$'s lateral S/D portion $110_L$ can include a convex sidewall proximate to the cross-sectional line (e.g., cross-sectional line F-F), while side surface 115 of S/D region $110_3$'s lateral S/D portion $110_R$ can include a straight slanting sidewall proximate to the same cross-sectional line (e.g., cross-sectional line F-F). In some embodiments, both the convex sidewall and the straight slanting sidewall can connect S/D region $110_3$'s top surface 111 and fin structure 108. By way of example and not limitation, the above-noted shape asymmetry between S/D region $110_3$'s lateral S/D portions $110_L$ and $110_R$ can be achieved by method 200 (discussed below).

In some embodiments, the shapes of lateral S/D portions $110_L$ and $110_R$ can be substantially asymmetric to each other with respect to cross-sectional line E-E, where lateral S/D portions $110_L$ and $110_R$ can both include convex sidewalls with different radius of curvature between each other. For example, referring to FIG. 1E, for a cross-sectional line (e.g., cross-sectional line H-H) substantially parallel to substrate 106 and crossing S/D region 110 (e.g., S/D region $110_3$), S/D region $110_3$'s side surfaces 113 and 115 can both include convex sidewalls proximate to the cross-sectional line (e.g., cross-sectional line H-H), while lateral width $W_2$ between side surface 115's convex sidewall and fin structure 108's side surface $108_R$ (e.g., point N) can be narrower than lateral width $W_1$ between side surface 113's convex sidewall and fin structure 108's side surface $108_L$ (point M).

In some embodiments, for a cross-sectional line (e.g., cross-sectional line H-H) substantially parallel to substrate 106 and crossing S/D region 110 (e.g., S/D region $1103$), S/D region $110_3$'s side surfaces 113 and 115 can both include convex sidewalls proximate to the cross-sectional line (e.g., cross-sectional line H-H), where a ratio of side surface 115's convex sidewall's radius of curvature to side surface 113's convex sidewall's radius of curvature can be from about 1.1 to about 10.0, from about 1.1 to about 5.0, from about 1.1 to about 3.0, from about 1.1 to about 2.0, from about 1.2 to about 1.8, from about 1.25 to about 1.5, or from about 1.25 to about 1.4. In some embodiments, side surface 115's convex sidewall can be laterally (e.g., in the y-direction) positioned between fin structure 108's side surfaces $108_L$ and $108_R$, where lateral width $W_2$ can be less than about 10 nm. By way of example and not limitation, the above-noted asymmetric convex sidewalls in S/D region 110 can be achieved by method 200 (discussed below).

In some embodiments, the shapes of lateral S/D portions $110_L$ and $110_R$ can be substantially asymmetric to each other with respect to cross-sectional line E-E, where one of lateral S/D portions $110_L$ and $110_R$ can include a shoulder structure between top surface 111 and side surfaces 113 or between top surface 111 and side surface 115. For example, referring to FIG. 1F, S/D region $110_3$'s side surfaces 113 and 115 can both include convex sidewalls proximate to cross-sectional line H-H, where side surface 115 can further include a shoulder structure 117 connecting the side surface 115's convex sidewall and top surface 111. In some embodiments, a lateral width $W_5$ between shoulder structure 117 and fin structure 108's side surface $108_R$ (e.g., point N) can be narrower than lateral width $W_2$ between side surface 115's convex sidewall and fin structure 108's side surface $108_R$ (point N). In some embodiments, a ratio of lateral width $W_5$ to lateral width $W_2$ can range from about 0 to about 0.8, from about 0 to about 0.6, or from about 0 to about 0.4. In some embodiments, lateral width $W_5$ can be from about 2 nm to about 15 nm. In some embodiments, for a cross-sectional line (e.g., cross-sectional line I-I) substantially parallel to substrate 106 and crossing S/D region 110 (e.g., S/D region $110_3$), S/D region $110_3$'s side surfaces 113 can include a slanting sidewall proximate to the cross-sectional line (e.g., cross-sectional line H-H), while S/D region $110_3$'s side surfaces 115 can include shoulder structure 117 proximate to the cross-sectional line (e.g., cross-sectional line H-H). By way of example and not limitation, the above-noted shoulder structure 117 can be achieved by the later discussed method 200 (discussed below).

In some embodiments, the shapes of lateral S/D portions $110_L$ and $110_R$ can be substantially asymmetric to each other with respect to cross-sectional line E-E, where one of lateral S/D portions $110_L$ and $110_R$ can include a convex sidewall and the other can include a concave sidewall. For example, referring to FIG. 1G, S/D region $110_3$'s side surfaces 113 and 115 can respectively include a convex sidewall and a concave sidewall proximate to cross-sectional line H-H. In some embodiments, side surface 115's concave sidewall can be laterally (e.g., in the y-direction) positioned between fin structure 108's side surfaces $108_L$ and $108_R$. In some embodiments, side surface 115's concave sidewall can be laterally (e.g., in the y-direction) formed over fin structure 108's side surface $108_L$.

In some embodiments, S/D region 110 can be formed over a multiple fin structures 108, where one of S/D region 110's side surfaces can have a reduced side extension (e.g., along the y-direction) compared to that of other S/D regions 110. For example, referring to FIG. 1H, S/D region $110_3$ can be formed merging on a multiple fin structures 108 (e.g., fin structures $108_1$ and $108_2$). The multiple fin structures 108 can have an outermost fin structure 108 (e.g., fin structure $108_1$) having surface $108_L$, and another outermost fin structure 108 (e.g., fin structure $108_2$) having surfaces $108_R$. Surface 104 can be proximate to S/D region $110_3$'s side surface 113. Similarly, surface $108_R$ can be proximate to S/D region $110_3$'s side surface 115. Cross-sectional line F-F can cross points R and S respectively over side surfaces $108_L$ and $108_R$. Accordingly, a lateral width $W_7$ between S/D region $110_3$'s lateral S/D portion $110_R$'s side surface 115 and the multiple fin structures 108's outermost side surface $108_R$ (e.g., point S) can be narrower than a lateral width $W_6$ between S/D region $110_3$'s lateral S/D portion $110_L$'s side surface 113 and the fin structure 108's another outermost side surface 104 (point R). In some embodiments, a difference between lateral widths $W_6$ and $W_7$ can be from about 1 nm to about 30 nm, from about 3 nm to about 20 nm, or from about 5 nm to about 20 nm. In some embodiments, a ratio of lateral width $W_7$ to lateral width $W_6$ can range from about 0.05 to about 0.8, from about 0.05 to about 0.6, or from about 0.05 to about 0.4. Further, similar to the embodiments in FIGS. 1C-1G, the shapes of both sides of merged S/D region $110_3$ can be substantially asymmetric to each other. For example, S/D region $110_3$ shown in FIG. 1H can have side surfaces 113 and 115 (including convex sidewalls) with different radii of curvature from each other. In some embodiments, one of side surfaces 113 and 115 can include a shoulder structure, while the other does not. In some embodiments, one of side surfaces 113 and 115 can include a convex sidewall, while the other can include a concave sidewall. By way of example and not limitation, the above-noted lateral extension width difference/ratio and shape asymmetry for S/D region $110_3$ can be achieved by method 200 (discussed below).

Referring to FIG. 1A, FET 102 can further include S/D contact 124 formed over S/D region 110 to electrically connect the underlying S/D region 110 to other elements of the integrated circuit (not shown in FIG. 1A). S/D contact 124 can include a silicide layer and a conductive region over the silicide layer (not shown in FIG. 1A). The silicide layer can include metal silicide and can provide a low resistance interface between the conductive regions and the underlying S/D region 110. Examples of metal used for forming the metal silicide can be Co, Ti, and Ni. The conductive region can include conductive materials, such as W, Al, and Co. The conductive region can have an average horizontal dimension (e.g., width in the y-direction) in a range from about 15 nm to about 25 nm and can have an average vertical dimension (e.g., height in the z-direction) in a range from about 400 nm to about 600 nm. In some embodiments, at least one conductive liner (not shown) can be disposed between the silicide layer and the conductive region. The conductive liner can be a diffusion barrier and can include a single layer or a stack of conductive materials, such as TiN, Ti, Ni, TaN, Ta, and a combination thereof. In some embodiments, the conductive liner can act as an adhesion-promoting-layer, a glue-layer, a primer-layer, a protective-layer, and/or a nucleation-layer. The conductive liner can have a thickness in a range from about 1 nm to about 2 nm, according to some embodiments. Based on the disclosure herein, other materials and dimensions for the conductive liner, the silicide layer, and the conductive region are within the scope and spirit of this disclosure.

Referring to FIGS. 1A and 1B, semiconductor device 100 can further include etch stop layer (ESL) 116, interlayer dielectric (ILD) layer 118, and shallow trench isolation regions 138. ESL 116 can protect gate structure 112 and/or S/D region 110. This protection can be provided, for example, during formation of ILD layer 118 and/or S/D contact 124. ESL 116 can be disposed on surfaces of S/D region 110 and/or sidewalls of gate spacers 114. In some embodiments, ESL 116 can include, for example, silicon nitride, silicon oxide, silicon oxynitride, silicon carbide, silicon carbo-nitride, boron nitride, silicon boron nitride, silicon carbon boron nitride, or a combination thereof. In some embodiments, ESL 116 can have a thickness ranging from about 3 nm to about 30 nm. Other materials and thicknesses for ESL 116 are within the scope and spirit of this disclosure.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 118 can have a thickness from about 50 nm to about 200 nm. Other materials, thicknesses, and formation methods for ILD layer 118 are within the scope and spirit of this disclosure.

Referring to FIGS. 1A-1D, semiconductor device 100 can further include an isolation structure 104 disposed between two horizontally (e.g., in the y-direction) adjacent S/D regions 110. For example, isolation structure 104 can be disposed between S/D regions $110_1$ and $110_2$. In some embodiments, isolation structure 104 can be further formed protruding into an portion of STI region 138. In some embodiments, isolation structure 104 can be further formed through STI region 138 and protruding into an portion of substrate 106. Isolation structure 104 can include one or more layers, in which each layer can includes an insulating material, such as silicon oxide, silicon nitride, a high-k dielectric, and a low-k dielectric, to electrically isolate S/D regions 110 placed at opposite sides of isolation structure 104. In some embodiments, isolation structure 104 and ESL 116 can be made of different insulating materials. In some embodiments, isolation structure 104 and ESL 116 can be made of insulating materials having different etching selectivities. In some embodiments, isolation structure 104 and STI region 138 can be made of different insulating materials. In some embodiments, isolation structure 104 and STI region 138 can be made of insulating materials having different etching selectivities. In some embodiments, as shown in FIGS. 1C and 1D, isolation structure 104 can be in contact with portions of ESL 116, where the portions of ESL 116 can be further in contact with S/D region 110. In some embodiments, isolation structure 104 can extend through gate structure 112 (e.g., along the x-axis) and be disposed over STI region 138. In some embodiments, isolation structures 104 can electrically isolate gate structures 112 traversed through by isolation structure 104. A segment of gate structure 112 associated with FETs 102 on fin structure $108_1$ can be electrically insulated from another segment of gate structure 112 associated with FETs 102 on fin structure $108_2$.

Figure 2:
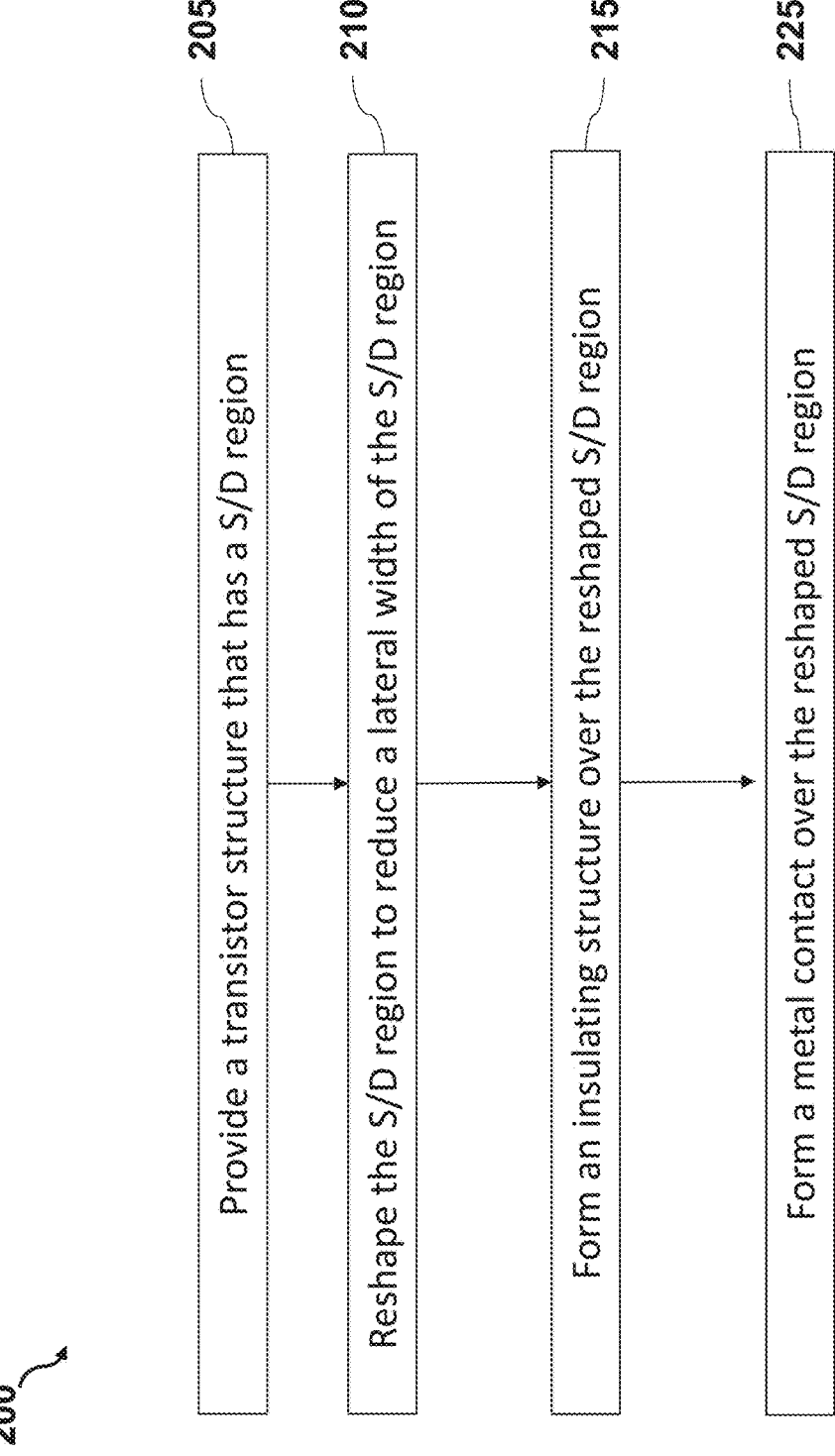
FIG. 2 is a flow diagram of a method for fabricating a semiconductor device, according to some embodiments.
Figures 3A, 3B:
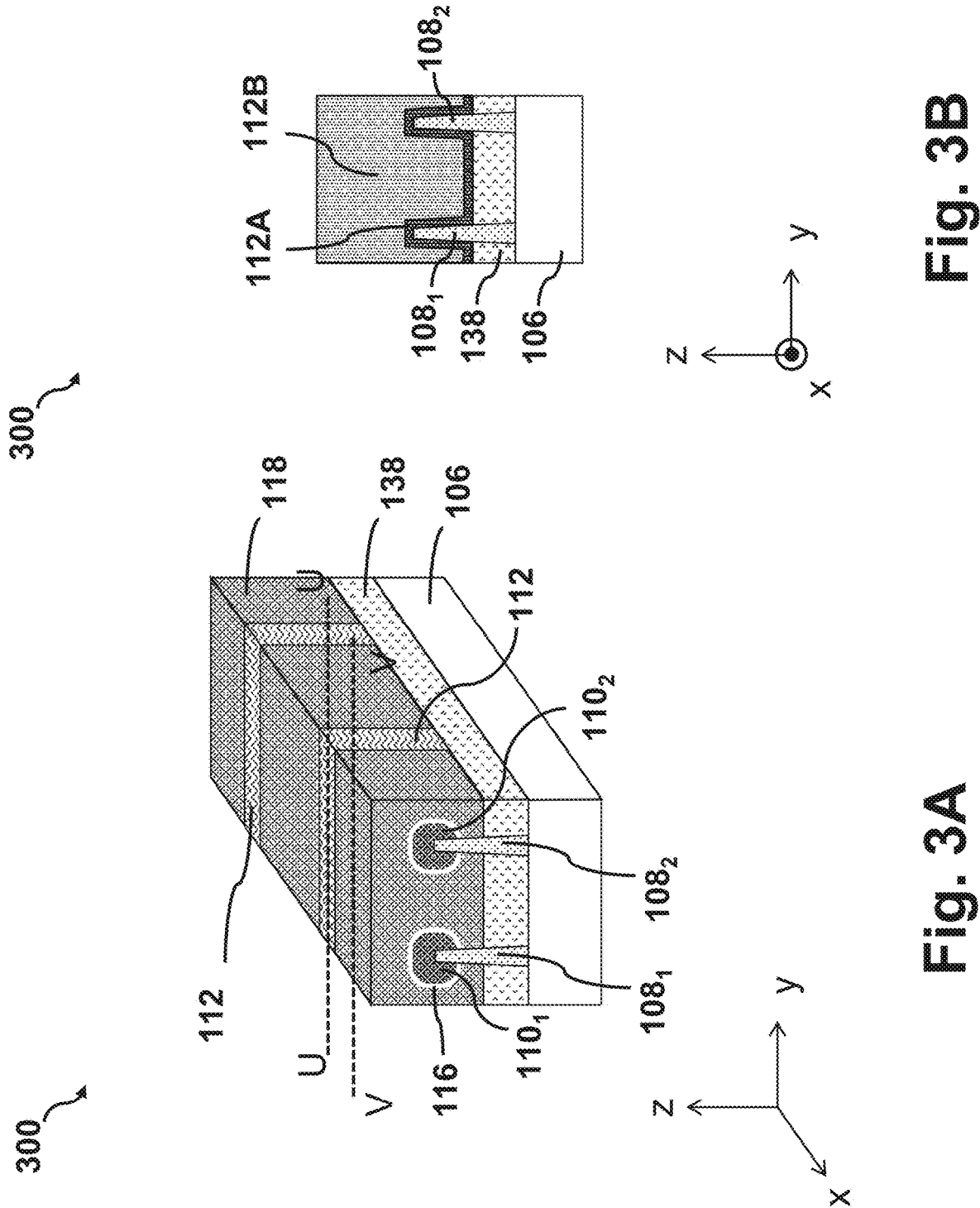
FIGS. 3A-3D illustrate cross-sectional views of a semiconductor device at various stages of its fabrication process, according to some embodiments.
Figures 3C, 3D:
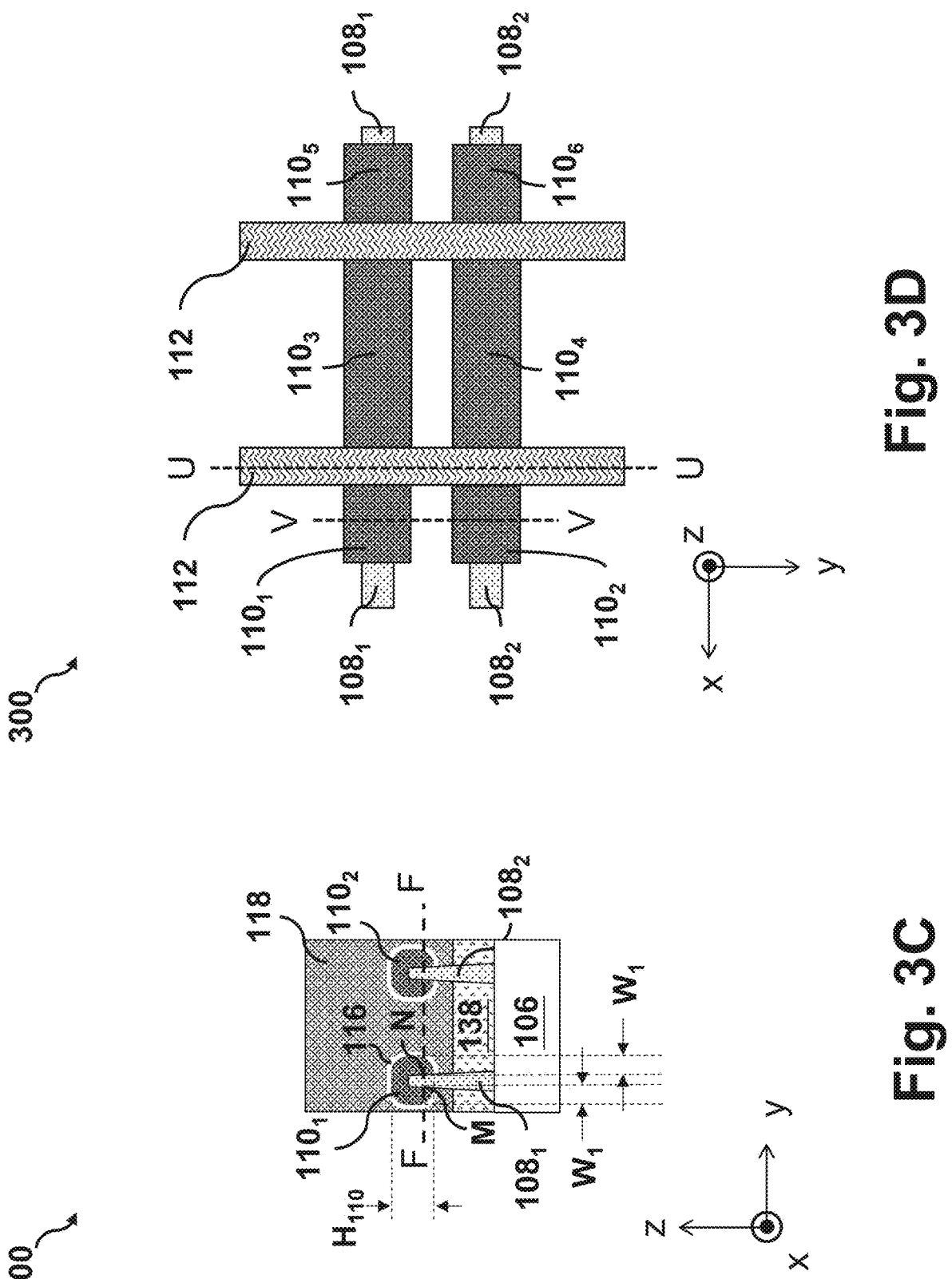

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-3D, 4A-9A, and 4B-9B. FIG. 3A is an isometric view of semiconductor device 100 at various stages of its fabrication, according to some embodiments. FIGS. 3B and 4A-9A are cross-sectional views along line U-U of structures of FIG. 3A at various stages of its fabrication, according to some embodiments. FIGS. 3C and 4B-9B are cross-sectional views along line V-V of structures of FIG. 3A at various stages of its fabrication, according to some embodiments. FIG. 3D is a top-view of FIG. 3A at various stages of its fabrication, according to some embodiments. Operations can be performed in a different order or not performed depending on specific applications. Method 200 may not produce a complete semiconductor device 100. Accordingly, it is understood that additional processes can be provided before, during, and/or after method 200, and that some other processes may only be briefly described herein. Further, the discussion of elements in FIGS. 1A-1H, 3A-3D, 4A-9A, and 4B-9B with the same annotations applies to each other, unless mentioned otherwise.

Referring to FIG. 2, in operation 205, a transistor structure with one or more S/D regions is provided. For example, FIGS. 3A-3D show a semiconductor device 300 with one or more FETs 102 having S/D regions 110. By way of example and not limitation, a process of forming semiconductor device 300 can include forming fin structure 108 on substrate 106, forming STI region 138 adjacent to fin structure 108, forming gate structure 112 traversing through fin structure 108, and forming S/D regions 110 over fin structure 108 and adjacent to gate structure 112. In some embodiments, S/D region 110 can be grown by (i) CVD, such as low pressure CVD (LPCVD), atomic layer CVD (ALCVD), ultrahigh vacuum CVD (UHVCVD), reduced pressure CVD (RPCVD), and any other suitable CVD technique; (ii) molecular beam epitaxy (MBE) processes; (iii) any suitable epitaxial process; or (iv) a combination thereof. In some embodiments, S/D region 110 can be in-situ doped during the epitaxial growth process using p-type precursors (e.g., diborane or boron trifluoride) or n-type precursors (e.g., phosphine or arsine). In some embodiments, the resulting S/D region 110 can have a height $H_{110}$ ranging from about 15 nm to about 80 nm, from about 25 nm to about 65 nm, or from about 25 nm to about 50 nm. In some embodiments, the resulting S/D region 110 can have a substantially equal lateral width $W_1$ at both sides of fin structure 108. The process of forming semiconductor device 300 can further include forming ESL 116 over S/D region 110 and forming ILD layer 118 over ESL 116 and a portion of fin structure 108 not covered by gate structure 112. Based on the disclosure herein, other formation methods for semiconductor device 300 are within the spirit and scope of this disclosure.

Figures 4A, 4B:
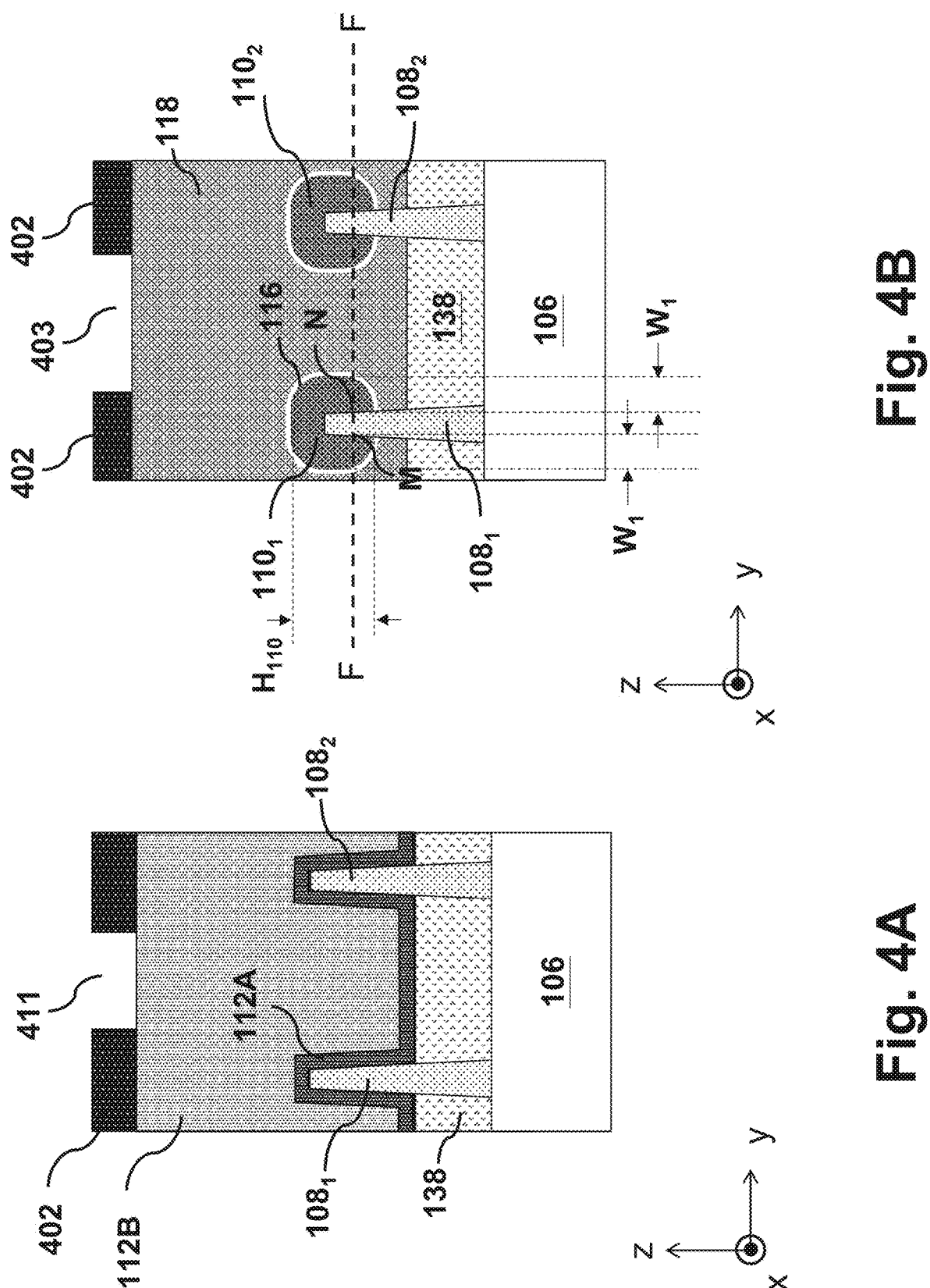
Figures 5A, 5B:
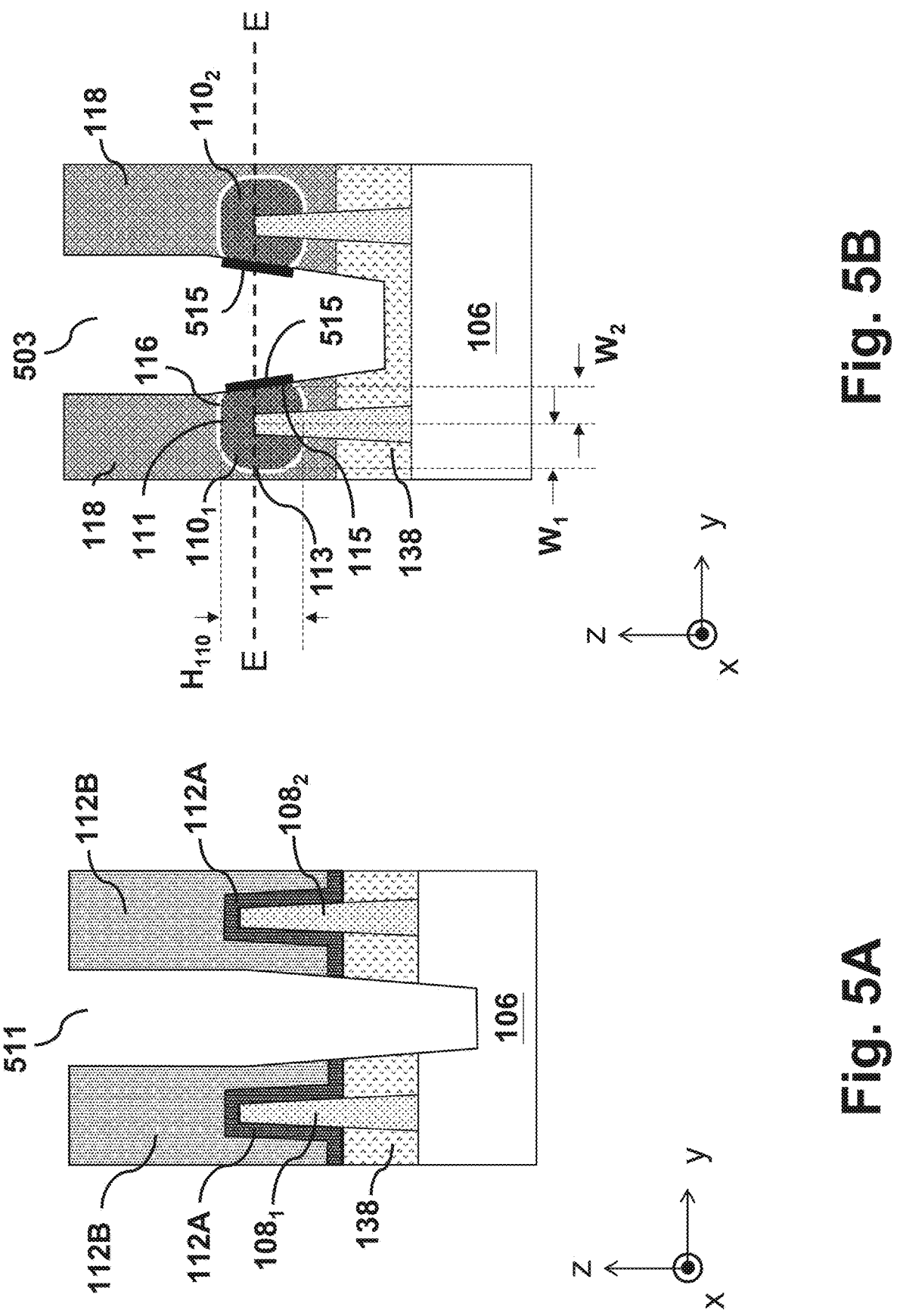

Referring to FIG. 2, in operation 210, S/D region 110 is reshaped to reduce its lateral width. For example, as shown in FIG. 5B, S/D region $110_1$ can be reshaped to reduce its lateral width from $W_1$ to $W_2$ at side surface 115, as described with reference to FIGS. 4A-4B and 5A-5B. In some embodiments, a process of reshaping S/D region 110 can include (i) patterning a mask layer 402 (shown in FIGS. 4A and 4B) on substrate 106 and (ii) removing S/D region 110 through the patterned mask layer 402 to reduce S/D region 110's lateral width from $W_1$ to $W_2$ (shown in FIGS. 5A and 5B).

By way of example and not limitation, mask layer 402 can be a thin film including silicon oxide or silicon nitride formed, for example, using a deposition process. In some embodiments, as shown in FIG. 4B, the process of patterning mask layer 402 can form an opening 403 over S/D regions 110 and ILD layer 118 using a lithography process and an etching process. In some embodiments, opening 403 can vertically overlap with portions of underlying S/D regions 110. In some embodiments, as shown in FIG. 4A, the process of patterning mask layer 402 can further form an opening 411 between two adjacent fin structures 108 to expose gate structure 112.

Referring to FIG. 5B, the process of removing S/D region 110 can include forming a recess 503 through ILD layer 118, a portion of ESL 116 that covers S/D region 110, a portion of S/D region 110 under opening 403, and a portion of STI region 138 by using an etch-back process. Therefore, recess 503 can expose side surface 115 of another portion of S/D region 110 that is outside opening 403 (e.g., under mask layer 402). Namely, the etch-back process can etch a side of S/D region 110 to expose side surface 115, while an opposite side (e.g., side surface 113) of S/D region 110 can be masked under mask layer 402. Accordingly, after the etch-back process, S/D region 110's lateral width can be decreased from width $W_1$ to width $W_2$. In some embodiments, the etch-back process can etch ILD layer 118 and S/D region

110 with a substantially equal etching rate, where the resulting recess 503 can expose side surface 115 that can include a substantially straight slanting sidewall (shown in FIG. 1C) after the etch-back process. In some embodiments, the etch-back process can be orientation dependent, where the resulting recess 503 can expose side surface 115 that can include a convex sidewall (shown in FIG. 1E) after the etch-back process. In some embodiments, the etch-back process can be orientation independent, where the resulting recess 503 can expose side surface 115 that can include a concave sidewall (shown in FIG. 1G) after the etch-back process. In some embodiments, the etch-back process can etch ILD layer 118 with an etching rate faster than that for S/D region 110, where the resulting recess 503 can expose side surface 115 that can include a shoulder structure (shown in FIG. 1F) after the etch-back process. In some embodiments, the process of removing S/D region 110 can include maintaining S/D region 110's height $H_{110}$ after the etch-back process. For example, mask layer 502 can mask S/D region 110's top surface 111, while forming recess 503 with the etch-back process. Accordingly, S/D region 110's height $H_{110}$ can remain intact after the etch-back process. By way of example and not limitation, the etch-back process can include a dry etching process using suitable etch gas, such as an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), and an iodine-containing gas. In some embodiments, after the etch-back process, an interfacial layer 515 can be formed over the exposed side surface 115. The interfacial layer 515 can include a reaction product by intermixing material of S/D region 110 and the etching gas's elements during the etch-back process. In some embodiments, interfacial layer 515 can include iodine, chlorine, fluorine, or bromine.

In some embodiments, the process of removing S/D region 110 can further include splitting gate structure 112 connecting between two adjacent fin structures 108. For example, referring to FIG. 5A, the process of removing S/D region 110 can also form a recess 511 through gate dielectric layer 112A and gate electrode 112B between fin structures 108₁ and 108₂. In some embodiments, recess 511 can be further formed through STI region 138 and portion of substrate 106.

Figures 6A, 6B:
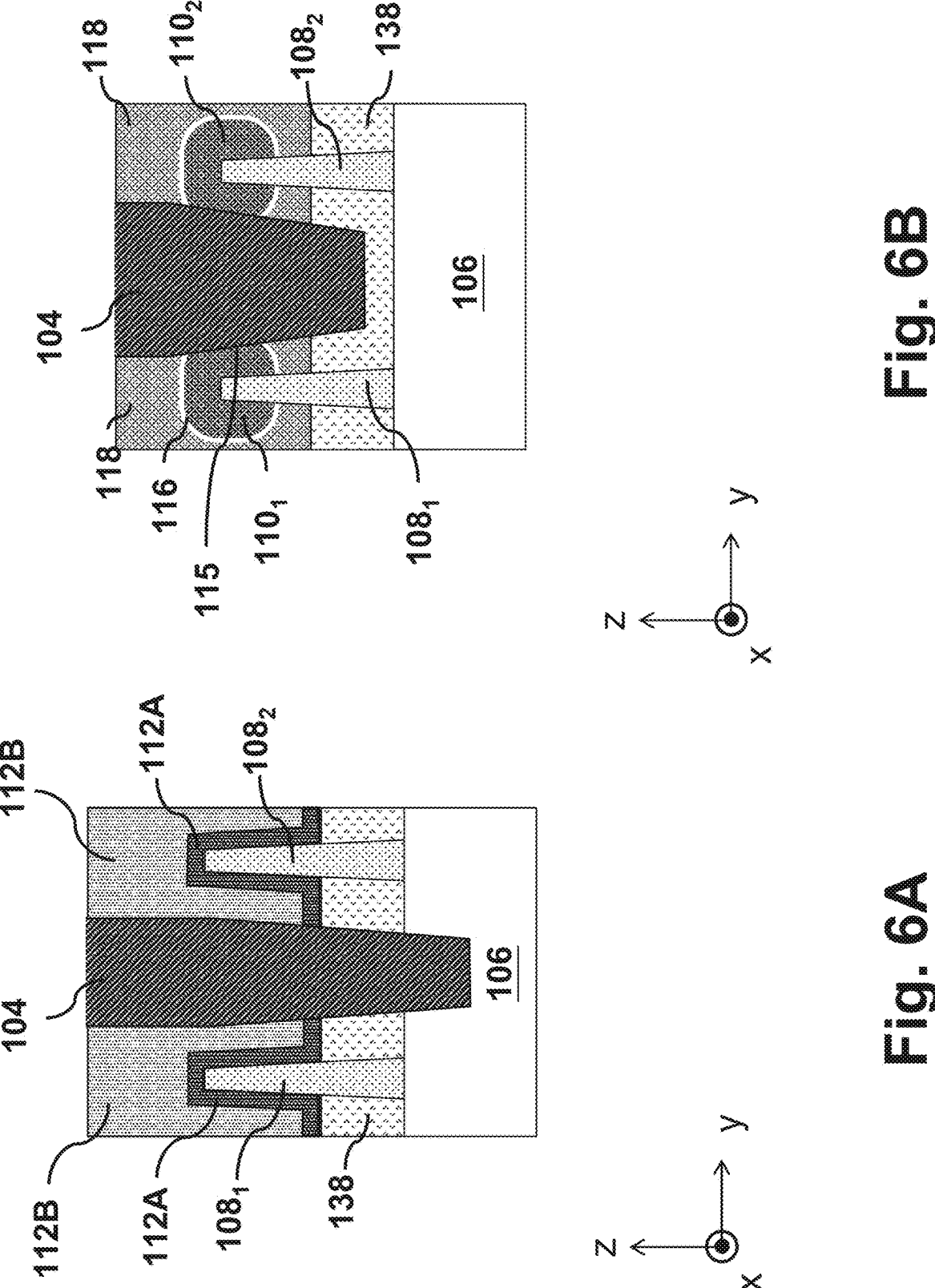
Figures 7A, 7B:
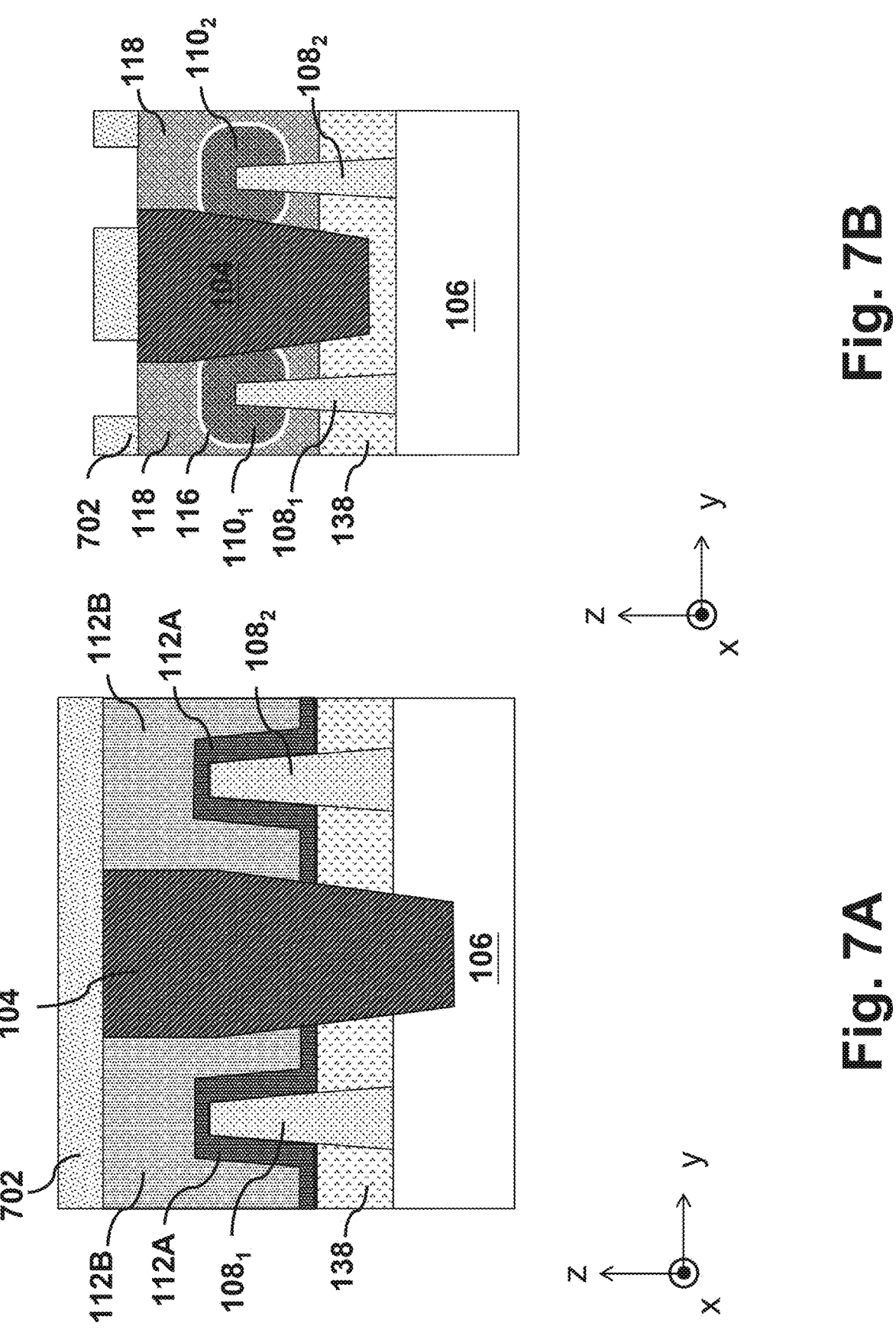
Figures 8A, 8B:
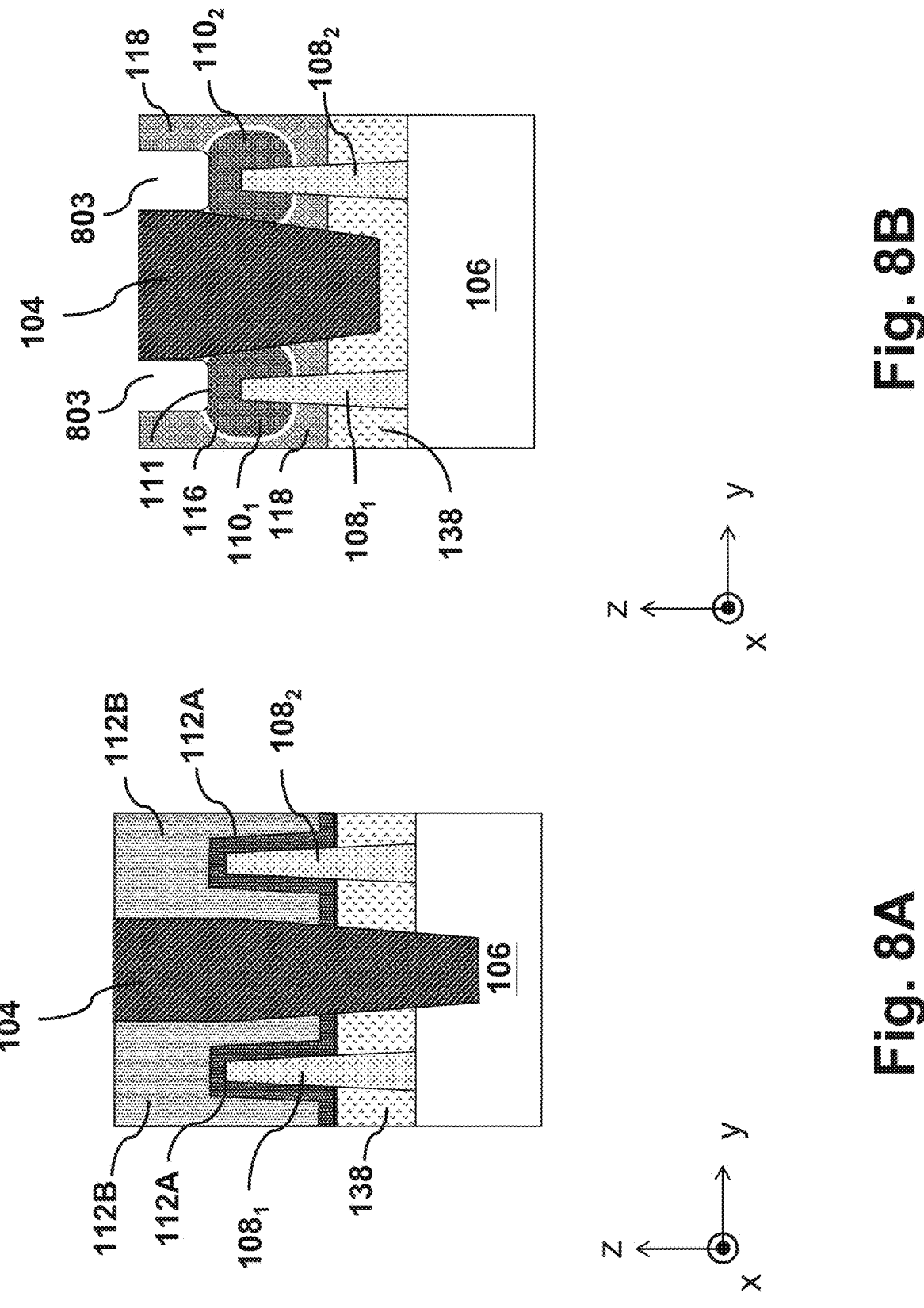

Referring to FIG. 2, in operation 215, an insulating structure is formed over the reshaped S/D region. For example, as shown in FIG. 6B, isolation structure 104 can be formed over S/D regions 110₁ and 110₂, as described with reference to FIGS. 6A and 6B. By way of example and not limitation, a process of forming isolation structure 104 can include (i) depositing a layer stack of insulating material over recess 503 using a suitable deposition process, such as atomic layer deposition (ALD), chemical vapor deposition (CVD), flowable CVD (FCVD), high-density-plasma (HDP) CVD, sub-atmospheric CVD (SACVD), and high aspect-ratio process (HARP) and (ii) chemical mechanical polishing (CMP) the layer stack of insulating material to coplanarize isolation structure 104 and ILD layer 118. In some embodiments, isolation structure 104 can be in contact with ESL 116 that surrounds S/D region 110. In some embodiments, isolation structure 104 can be in contact with side surface 115 of the reshaped S/D region 110. In some embodiments, isolation structure 104 can be formed between two adjacent reshaped S/D region 110. In some embodiments, as shown in FIG. 6A, the process of forming isolation structure 104 can further include depositing the layer stack of insulating material over recess 511, and CMP the layer stack of insulating material to form isolation structure to isolate two adjacent gate structures 112.

Figures 9A, 9B:
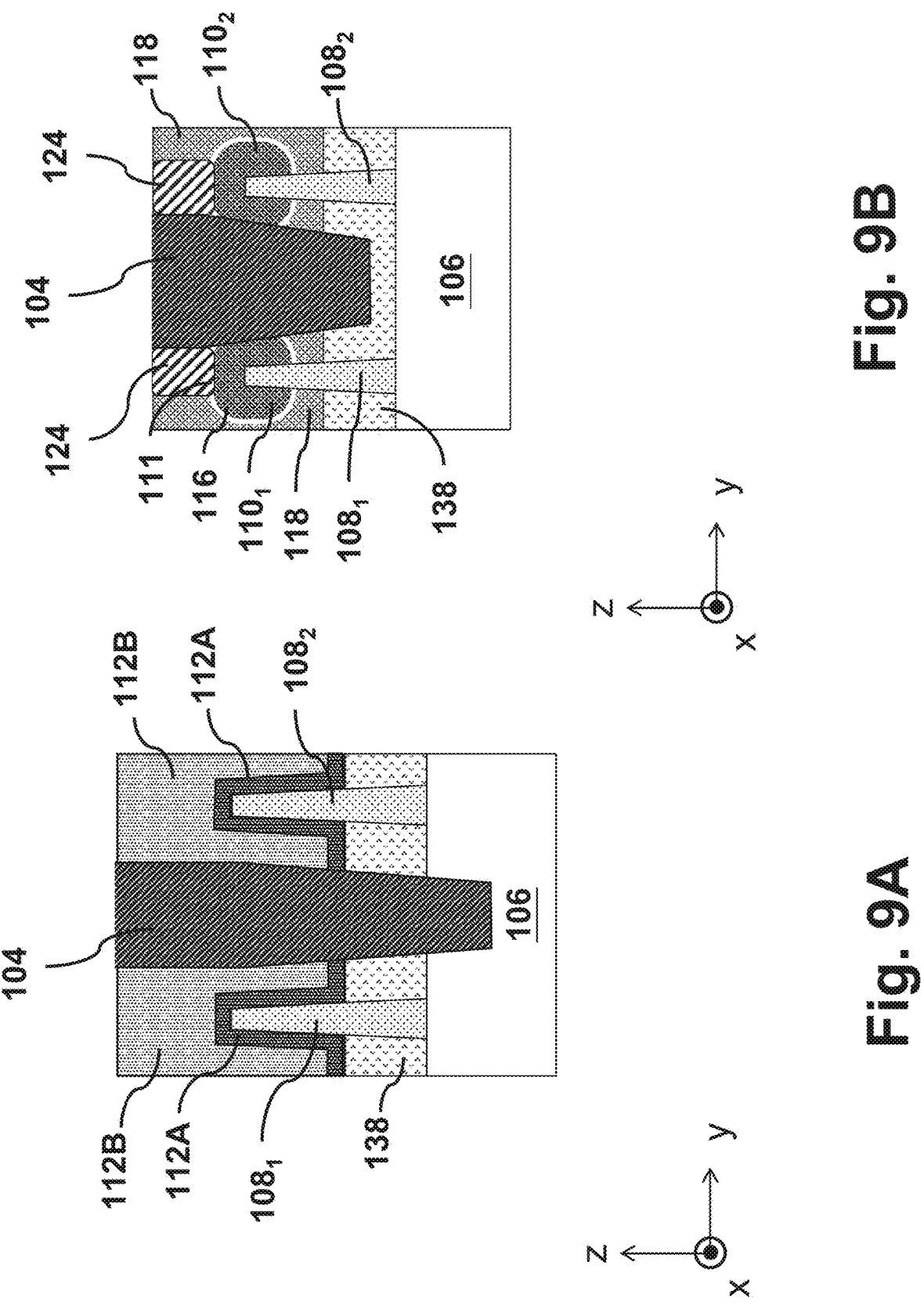

Referring to FIG. 2, in operation 220, a metal contact is formed over the reshaped S/D region 110. For example, as shown in FIG. 9B, S/D contact 124 can be formed the reshaped S/D 110's top surface 111 as described in reference to FIGS. 7A-9A and 7B-9B. By way of example and not limitation, a process of forming S/D contact 124 can include (i) forming a patterned mask layer 702 (shown in FIGS. 7A and 7B) to expose a portion of ILD layer 118 above S/D regions 110 using a lithography process, (ii) removing ILD layer 118 and ESL 116 through patterned mask layer 702 to form a recess 803 (shown in FIGS. 8A and 8B) that exposes S/D regions 110, (iii) depositing one or more conductive materials in recess 803 using a suitable deposition process (e.g., CVD, ALD, PVD, or e-beam evaporation), and (iv) polishing the deposited one or more conductive materials using a CMP process to form S/D contact 124 (shown in FIG. 9B). By way of example and not limitation, the one or more conductive materials for S/D contact 124 can include a metal silicide, a conductive nitride liner, or a metallic material such as W, Al, Cu, Ti, and Co. Accordingly, as shown in FIG. 9B, the resulting S/D contact 124 can be coplanarized with isolation structure 104 and ILD layer 118. Further, as shown in FIG. 9B, the resulting S/D contact 124 can be in contact with its underlying S/D regions 110's top surface 111.

Further, following operating 220, an interconnect structure (not shown in FIGS. 9A and 9B) can be formed over S/D contact 124 to provide electrical routing for semiconductor device 100. By way of example and not limitation, a process of forming the interconnect structure can include (i) blanket depositing an insulating stack over the structure of FIGS. 9A and 9B via a suitable deposition process, such as a CVD process, a PECVD process, a PVD process, and a ALD process, (ii) forming one or more vias (not shown in FIGS. 9A and 9B) through the deposited insulating stack using a lithography process and an etching process, and (iii) filling the one or more vias with one or more conductive material to form trench conductor layer (not shown in FIGS. 9A and 9B) using a suitable deposition process (e.g., CVD, ALD, PVD, or e-beam evaporation) and a polishing process (e.g., a CMP process). In some embodiments, the resulting trench conductor layer can be in contact with S/D contact 124. In some embodiments, the resulting trench conductor layer can be in contact with gate electrode 112B. In some embodiments, the process of forming the interconnect structure can further include depositing a layer of conductive material (not shown in FIGS. 9A and 9B) over the trench conductor layer using a suitable deposition process (e.g., CVD, ALD, PVD, or e-beam evaporation), where the layer of conductive material can provide an interconnect routing for the interconnect structure.

The present disclosures provides an exemplary S/D region structure and a method for forming the same. The S/D region can have a reduced lateral volume to minimize the parasitic capacitance between the gate terminal and the source/drain terminal of a transistor. In some embodiments, the S/D region can be grown on a fin structure, where the S/D region can be subsequently reshaped to reduce a lateral width at one side. In some embodiments, the reshaped S/D region can be asymmetric with respect to a midline that bisects the fin structure. A benefit of the reshaped S/D structure, among others, is to reduce the parasitic capacitance contributed from S/D region's lateral extension while maintaining a low contact resistance, thus enhancing the transistor's performance.

In some embodiments, a method for forming a semiconductor structure can include forming a fin structure over a substrate. The method can further include forming, over the fin structure, a source/drain region with a lateral width. The method can further include removing a portion of the source/drain region to decrease the lateral width of the source/drain region, and forming an insulating stack over the source/drain region with the decreased lateral width.

In some embodiments, a method for forming a semiconductor structure can include forming first and second fin structures over a substrate, forming a source/drain region over sidewalls of the first and second fin structures, removing a first portion of the source/drain region to expose a second portion of the source/drain region, and forming an insulating stack over the second portion of the source/drain region.

In some embodiments, a semiconductor structure can include a substrate, an insulating stack formed over the substrate, a vertical structure formed through the insulating stack, a source/drain region formed over the vertical structure, and an isolation structure formed adjacent to the source/drain region and protruding the insulating stack. The source/drain region can include a first side surface and a second side surface. A lateral separation between the first side surface and the vertical structure can be greater than an other lateral separation between the second side surface and the vertical structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an insulating stack formed over the substrate;
a vertical structure formed through the insulating stack;
a source/drain region extending laterally outward from the vertical structure, the source/drain region comprising a first side surface and a second side surface, wherein a lateral separation between the first side surface and the vertical structure is greater than a lateral separation between the second side surface and the vertical structure;
a gate structure over the vertical structure and adjacent to the source/drain region; and
an isolation structure extending parallel to the vertical structure, wherein the isolation structure comprises:
a first portion in contact with the second side surface, wherein the first portion comprises an upper portion, a middle portion, and a lower portion, and wherein a width of the middle portion is greater than widths of the upper and lower portions; and
a second portion adjacent to the gate structure, wherein a first height of the first portion is less than a second height of the second portion.

2. The semiconductor structure of claim 1, wherein the first side surface comprises a convex surface and the second side surface comprises a concave surface.

3. The semiconductor structure of claim 1, wherein the first side surface comprises a convex surface and the second side surface comprises a shoulder structure.

4. The semiconductor structure of claim 1, further comprising a metal contact formed over a top surface of the source/drain region.

5. The semiconductor structure of claim 1, wherein a curved interface between the first portion and the source/drain region is above a slanted side surface of the first portion.

6. The semiconductor structure of claim 1, wherein the first portion further comprises a bottom portion below the lower portion, and wherein a width of the bottom portion is less than the width of the lower portion.

7. A structure, comprising:
a fin structure on a substrate;
a source/drain (S/D) region over top and side surfaces of a top portion of the fin structure, wherein the S/D region comprises first and second portions on first and second sides of the fin structure, respectively, wherein the second portion comprises an upper portion and a lower portion, wherein a width of the upper portion is less than a width of the lower portion, wherein a curved surface of the second portion comprises a concave portion, and wherein a width of the first portion is greater than a width of the second portion; and
an isolation structure protruding into the concave portion, wherein the isolation structure is in contact with the upper portion and isolated from the lower portion.

8. The structure of claim 7, wherein the second portion comprises a shoulder structure.

9. The structure of claim 7, further comprising an interlayer dielectric layer between the lower portion and the isolation structure.

10. The structure of claim 7, further comprising an etch stop layer on the lower portion and the isolation structure.

11. The structure of claim 7, further comprising a gate structure over the fin structure and in contact with the isolation structure, wherein an interface between the isolation structure and the gate structure is substantially flat.

12. The structure of claim 7, wherein the isolation structure comprises an upper section having a convex surface and a lower section having a slanted surface.

13. The structure of claim 7, further comprising an etch stop layer below the lower portion, wherein the isolation structure comprises a portion directly above the etch stop layer.

14. A structure, comprising:
a shallow trench isolation (STI) region on a substrate;
first and second fin structures through the STI region;
first and second source/drain (S/D) structures on the first and second fin structures, respectively;
first and second gate structures over the first and second fin structures, respectively; and
an isolation structure between the first and second fin structures and in contact with concave surfaces of the first and second S/D structures, wherein the isolation structure comprises:
a first portion between and protruding horizontally into the first and second S/D structures, wherein a first bottom surface of the first portion is below the first and second S/D structures; and
a second portion between the first and second gate structures, wherein a second bottom surface of the second portion is below the first bottom surface.

15. The structure of claim 14, wherein the first S/D structure is asymmetric with respect to a vertical line bisecting the first fin structure.

16. The structure of claim 14, further comprising an interlayer dielectric layer between the first S/D region and the isolation structure and between the second S/D region and the isolation structure.

17. The structure of claim 14, wherein each of the first and second S/D structures comprises a shoulder structure in contact with the isolation structure.

18. The semiconductor structure of claim 1, wherein:
a bottom surface of the first portion is above the substrate; and
the second portion protrudes into the substrate.

19. The structure of claim 14, wherein the first portion comprises an upper portion and a lower portion in contact with the first S/D structure, and wherein a width of the lower portion is greater than a width of the upper portion.

20. The structure of claim 14, wherein the second portion comprises an upper portion in the STI region and a lower portion in the substrate, and wherein a width of the upper portion is greater than a width of the lower portion.

\* \* \* \* \*